United States Patent
Wong et al.

(10) Patent No.: US 10,403,625 B2
(45) Date of Patent: Sep. 3, 2019

(54) HETEROJUNCTION FIELD EFFECT TRANSISTOR DEVICE WITH SERIALLY CONNECTED ENHANCEMENT MODE AND DEPLETION MODE GATE REGIONS

(71) Applicant: Synopsys, Inc., Mountain View, CA (US)

(72) Inventors: Hiu Yung Wong, Cupertino, CA (US); Nelson de Almeida Braga, San Diego, CA (US); Rimvydas Mickevicius, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/159,483

(22) Filed: Oct. 12, 2018

(65) Prior Publication Data

US 2019/0148371 A1 May 16, 2019

Related U.S. Application Data

(63) Continuation of application No. 15/599,984, filed on May 19, 2017, now Pat. No. 10,128,232.

(Continued)

(51) Int. Cl.
*H01L 29/778* (2006.01)
*H01L 27/085* (2006.01)
(Continued)

(52) U.S. Cl.
CPC ...... *H01L 27/085* (2013.01); *H01L 29/42376* (2013.01); *H01L 29/7786* (2013.01);
(Continued)

(58) Field of Classification Search
CPC ............... H01L 27/085; H01L 29/7786; H01L 29/42376; H01L 27/0883; H01L 29/0657;
(Continued)

(56) References Cited

U.S. PATENT DOCUMENTS 6,144,048 A 11/2000 Suemitsu et al.
8,587,031 B2 11/2013 Lu et al.
(Continued)

FOREIGN PATENT DOCUMENTS

CN 107924917 A 4/2018
WO 2017/112657 A1 6/2017

OTHER PUBLICATIONS

Lu, B., "High-Performance Integrated Dual-Gate AlGaN/GaN Enhancement-Mode Transistor," IEEE Electron Device Letters, vol. 31, No. 9, Sep. 2010, pp. 990-992.

(Continued)

*Primary Examiner* — Joseph C. Nicely
*Assistant Examiner* — Pavel G Ivanov
(74) *Attorney, Agent, or Firm* — Haynes Beffel & Wolfeld LLP

(57) ABSTRACT

Roughly described, a heterojunction field effect transistor device includes a first piezoelectric layer supporting a channel region, a second piezoelectric layer over the first, and a source and drain. A dielectric layer over the second piezoelectric layer electrically separates the source and drain, and has a plurality of segments, two of them separated by a first gap. A first gate has a first tine, the first tine within the first gap, the first gap having a length of less than about 200 nm. In the first piezoelectric layer immediately beneath the second piezoelectric layer, directly beneath the first gap, stress in the dielectric layer creates a piezoelectric charge of at least about $1 \times 10^{11}$ per $cm^2$ of electronic charge. The first gate controls a normally off segment of the channel region. A second gate, having a length of at least 500 nm, controls a normally on segment of the channel region.

24 Claims, 12 Drawing Sheets

Related U.S. Application Data

(60) Provisional application No. 62/339,262, filed on May 20, 2016.

(51) Int. Cl.
  *H01L 29/423* (2006.01)
  *H01L 27/088* (2006.01)
  *H01L 29/20* (2006.01)
  *H01L 29/205* (2006.01)
  *H01L 29/06* (2006.01)

(52) U.S. Cl.
  CPC ...... *H01L 27/0883* (2013.01); *H01L 29/0657* (2013.01); *H01L 29/2003* (2013.01); *H01L 29/205* (2013.01); *H01L 29/42316* (2013.01); *H01L 29/7787* (2013.01)

(58) Field of Classification Search
  CPC ............... H01L 29/2003; H01L 29/205; H01L 29/7787; H01L 29/42316
  See application file for complete search history.

(56) References Cited

U.S. PATENT DOCUMENTS

| | | |
|---|---|---|
| 2007/0228416 A1 | 10/2007 | Chen et al. |
| 2008/0230784 A1 | 9/2008 | Murphy |
| 2008/0283870 A1 | 11/2008 | Sato |
| 2009/0032820 A1 | 2/2009 | Chen |
| 2013/0161641 A1 | 6/2013 | Kub et al. |
| 2014/0239346 A1 | 8/2014 | Green et al. |
| 2015/0162424 A1 | 6/2015 | Briere |
| 2017/0186860 A1 | 6/2017 | Wong et al. |

OTHER PUBLICATIONS

Moon, J.S., et al., >70% Power-Added-Efficiency Dual-Gate, Cascode GaN HEMTs Without Harmonic Tuning, IEEE Electron Device Letters, vol. 37, No. 3, Mar. 2016, pp. 272-276.

PCT/US2017/033523—International Search Report and Written Opinion dated Jul. 27, 2017, 11 pages.

Besland, et al. "Interpretation of stress variation in silicon nitride films deposited by electron cyclotron resonance plasma." Journal of Vacuum Science & Technology A: Vacuum, Surfaces, and Films 22.5 (2004): 1962-1970.

DE 11 2017 000 055.6—First Examination Report dated Feb. 27, 2018, 8 pages.

DE 11 2017 000 055.6—Voluntary Amendments as filed Feb. 9, 2018, 19 pages.

U.S. Appl. No. 15/599,984—Notice of Allowance dated Jul. 18, 2018, 26 pages.

DE 11 2017 000 055.6—Response to First Examination Report dated Feb. 27, 2018 filed Jun. 9, 2018, 13 pages.

Gupta et al., "7-nm FinFET CMOS design enabled by stress engineering using Si, Ge, and Sn," IEEE Transactions on Electron Devices 61, No. 5 , May 2014, pp. 1222-1230.

DE 11 2017 000 055.6—Response to Summons to Attend Oral Proceedings dated Dec. 10, 2018, as filed Jan. 18, 2019, 57 pages.

US 10,403,625 B2

HETEROJUNCTION FIELD EFFECT TRANSISTOR DEVICE WITH SERIALLY CONNECTED ENHANCEMENT MODE AND DEPLETION MODE GATE REGIONS

CROSS REFERENCE TO RELATED APPLICATION

This application is a continuation of U.S. Non-Provisional application Ser. No. 15/599,984, entitled "HETEROJUNCTION FIELD EFFECT TRANSISTOR DEVICE WITH SERIALLY CONNECTED ENHANCEMENT MODE AND DEPLETION MODE GATE REGIONS," filed on May 19, 2017, by Hiu Yung Wong, Nelson de Almeida Braga, and Rimvydas Mickevicius, which application claims priority under 35 U.S.C. § 119(e) to U.S. Provisional Application No. 62/339,262, entitled "MONOLITHICALLY INTEGRATED III-NITRIDE CASCODE CIRCUIT FOR HIGH VOLTAGE APPLICATION," filed on May 20, 2016, by Hiu Yung Wong, Nelson de Almeida Braga, and Rimvydas Mickevicius, the entire contents of which are hereby incorporated by reference herein.

BACKGROUND

The present technology relates to a heterojunction field effect transistor (HFET) with enhancement mode (normally off) and depletion mode (normally on) regions which are serially connected.

HFETs (including high electron mobility transistors (HEMTs) or metal-insulator-semiconductor-HFETs (MISHFETs) or double-channel HFETs/HEMTs/MISHFETs or dual-Channel HFETs/HEMTs/MISHFETs, or thin-body (SOI, finFET, tri-gate, gate-all-around, etc.) HFETs/HEMTs/MISHFETs, may be used, for example, as switching devices. Such devices are typically formed of III-V semiconductors and achieve very high mobility by having an undoped channel region. In conventional HFETs, the device is described as "normally on"; i.e. the threshold voltage, also sometimes referred to herein as pinch-off voltage, is zero or negative, and the channel conducts electric current with little or no bias applied between source and gate. For power electronics applications, a normally off device is strongly preferred, for safety, energy conversion and circuit design reasons. For example, a normally on device will allow a significant amount of power to flow between source and drain in the event of a failure leading to a floating or grounded gate terminal.

It is known, in power applications, to arrange a normally off device serially connected to a normally on device. A conventional normally off device may be formed of silicon, while a normally on device is typically formed of other materials, for example III-V semiconductors. It can be complex and expensive, however, to combine different materials in a single fabrication process. It would be advantageous to form a normally off device serially connected to a normally on device using a streamlined fabrication process.

SUMMARY

The technology disclosed herein relates to an HFET device including a gate controlling a normally off channel region and a gate controlling a normally on channel region.

A heterojunction field effect device is described herein. The HFET device comprises an integrated circuit device including a heterojunction field effect transistor device. The heterojunction field effect transistor device comprises a first piezoelectric layer supporting a channel layer, a second piezoelectric layer over the first piezoelectric layer, an outer source, and an outer drain. The HFET device also comprises a dielectric layer over the second piezoelectric layer and electrically separating the outer source and outer drain longitudinally, and having a plurality of segments longitudinally, two segments of the plurality separated by a first gap. The HFET device further comprises a first gate. The first gate has a first tine connected to a first gate contact, the first tine within the first gap, the first gap having a length of less than about 200 nm, wherein in the first piezoelectric layer immediately beneath the second piezoelectric layer, directly beneath the first gap, stress in the dielectric layer creates a piezoelectric charge of at least about $1 \times 10^{11}$ per $cm^2$ of electronic charge. In addition to the first gate, there is also a second gate disposed within a second gap in the dielectric layer, the second gap longitudinally separating segments of the plurality of segments, the second gap having a length of at least 500 nm. The first gate controls a normally off segment of the channel layer, and the second gate controls a normally on segment of the channel region.

In embodiments, the first piezoelectric layer is substantially a crystalline first III-V semiconductor, and the second piezoelectric layer is substantially a crystalline second III-V semiconductor having a wider band gap than the crystalline first III-V semiconductor. The first and second piezoelectric layer may be substantially monocrystalline or polycrystalline.

In embodiments, the HFET device also includes an intermediate source and an intermediate drain, the first gate between the outer source and the intermediate drain, and the second gate between the intermediate source and the outer drain, and wherein the intermediate source and the intermediate drain are electrically connected.

The dielectric layer may be substantially silicon nitride.

In some embodiments, the first gate and the second gate are electrically connected, while in other embodiments, the first gate and the second gate are not electrically connected.

In embodiments, the first gate has a second tine connected to the first gate contact, the second tine disposed in a second gap in the dielectric layer, one segment of the plurality of segments of the dielectric layer disposed between the first tine and the second tine, the second gap having a length of less than about 200 nm.

In embodiments of the HFET device described herein, the first piezoelectric layer and the second piezoelectric layer meet at a heterojunction, and a shortest vertical distance between the first tine and the heterojunction, and a shortest vertical distance between the second gate and the heterojunction are substantially the same.

An integrated circuit device described herein includes an HFET device, the heterojunction field effect transistor device comprising a first piezoelectric layer supporting a channel region, a second piezoelectric layer over the first piezoelectric layer, an outer source, an intermediate drain, an intermediate source electrically connected to the intermediate drain, and an outer drain. The HFET device additionally includes a dielectric layer over the second piezoelectric layer and electrically separating the outer source and the intermediate drain, and having a plurality of segments, two segments of the plurality separated by a first gap. The device also includes a first gate disposed between the outer source and the intermediate drain, the first gate having a first tine connected to a first gate contact, the first tine within the first gap, the first gap having a length of less than about 200 nm; and a second gate disposed between the intermediate source and the outer drain. The second gate is disposed in a second gap in the dielectric layer, the second gap longitudinally separating segments of the plurality of segments, the second gap having a length of at least 500 nm. The first gate controls a normally off segment of the channel region, and the second gate controls a normally on segment of the channel region.

Another integrated circuit device including an HFET device is described herein, the HFET device comprising a first piezoelectric layer supporting a channel region, a second piezoelectric layer over the first piezoelectric layer, a source, and a drain. Additionally, the HFET device includes a dielectric layer over the second piezoelectric layer and between the source and the drain, and having a plurality of segments, the segments separated by a plurality of gaps. A first gate has a first tine connected to a first gate contact, the first tine within the first gap, the first gap having a length of less than about 200 nm; and a second gate is disposed between the first gate and the drain, and further disposed in a second gap of the plurality of gaps, the second gap having a length of at least 500 nm. The first gate controls a normally off segment of the channel region, and the second gate controls a normally on segment of the channel region.

Still another integrated circuit device including an HFET device is described herein, the HFET device comprising a first piezoelectric layer supporting a channel region, a second piezoelectric layer over the first piezoelectric layer, a source, and a drain. The HFET device also includes a dielectric layer over the second piezoelectric layer and between the source and the drain, and having a plurality of segments, the segments separated by a plurality of gaps. In addition, a first gate has a first tine connected to a first gate contact, the first tine within the first gap, the first gap having a length of less than about 200 nm; and a second gate is disposed between the first gate and the drain and further disposed in a second gap of the plurality of gaps, the second gap having a length of at least 500 nm. The first gate controls a normally off segment of the channel region, and the second gate controls a normally on segment of the channel region. The first piezoelectric layer and the second piezoelectric layer meet at a heterojunction, and a shortest vertical distance between the first tine and the heterojunction, and a shortest vertical distance between the second gate and the heterojunction are substantially the same.

DETAILED DESCRIPTION

Figure 1:
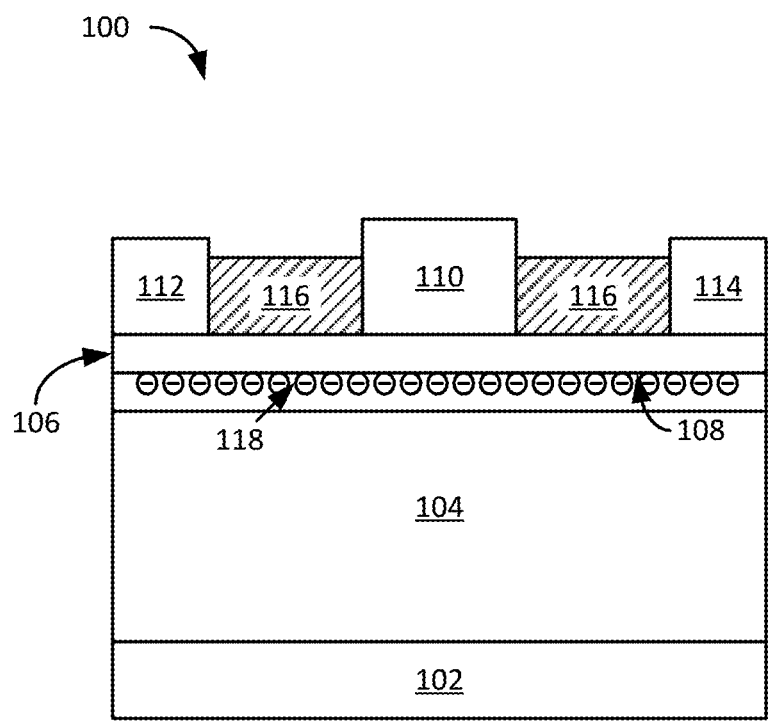
FIG. 1 shows a conventional HFET device.

FIG. 1 shows a conventional HFET device 100. Substrate 102 is a crystalline semiconductor substrate, for example, a silicon, silicon carbide, gallium nitride or sapphire wafer. Buffer 104 is typically formed of a crystalline III-V semiconductor material, for example a group III-nitride material, for example GaN. As will be seen, buffer 104 supports a channel 118 under suitable bias voltages. Barrier 106 is a different III-V semiconductor material having a wider band gap than the material of buffer 104, and may be, for example, $Al_xGa_{1-x}N$ where x may vary from, for example, about 0.1 to about 1. Barrier 106 and buffer 104 thus meet at heterojunction 108. Buffer 104 and barrier 106 are both piezoelectric layers, formed of materials having piezoelectric properties. Gate 110 is typically formed of a metal, for example a NiAu bilayer or alloy, that will form a Schottky barrier with barrier 106. In some devices, a thin gate dielectric (not shown) may intervene between gate 110 and barrier 106. Source 112 and drain 114 are electrically coupled to barrier 106, and are formed of a conductive material which forms an ohmic contact with barrier 106, for example TiN, metal layers such as Ti/Al/Ni/Au, or some other suitable material or combination of materials. In other examples, barrier 106 may be removed at the locations of source 112 and drain 114, and source 112 and drain 114 may be electrically coupled to buffer 104. Passivation layer 116 is conventionally silicon nitride, but may be some other dielectric material. Buffer 104 and barrier 106 are generally epitaxially grown from a seed layer, typically of AlN (not shown) deposited on substrate 102. In order to maximize electron mobility in channel region 118, buffer 104 is not intentionally doped, thus avoiding collisions with ionized dopant atoms, i.e. impurity scattering.

Polarization charge at the interface of barrier 106 and buffer 104 (at heterojunction 108) creates a layer of high-mobility electrons known as a two-dimensional electron gas (2DEG) at channel region 118.

When voltage differential is applied between drain 114 and source 112, the channel 118 conducts current with no voltage differential between source 112 and gate 110. The device is described as a "normally on" device, in that the transistor is on, even with zero or negative voltage bias applied between gate and source. Given a potential difference between drain and source, there will be current flow in channel 118 in the event of a failure leading to a floating or grounded gate terminal. For safety and for circuit simplicity, for most uses a normally off device is preferred over a normally on device. Note that FIG. 1, and subsequent figures, are not to scale.

It is known to arrange a normally off device, such as a silicon-based MOSFET, in series with a normally on HFET formed of III-V semiconductors, though the use of different materials creates fabrication challenges. It would be simpler to pair a normally on HFET formed of III-V semiconductors with a normally off device made using the same materials. It would be most advantageous to minimize fabrication differences between the two HFETs.

U.S. patent application Ser. No. 15/098,164, Wong et al., "Tined Gate to Control Threshold Voltage in a Device Formed of Materials Having Piezoelectric Properties," (hereinafter "the '164 application" and hereby incorporated by reference), having the same inventors and owned by the assignee of the present application, describes a III-V semiconductor HFET, made normally off by the use of stress engineering.

Figure 2:
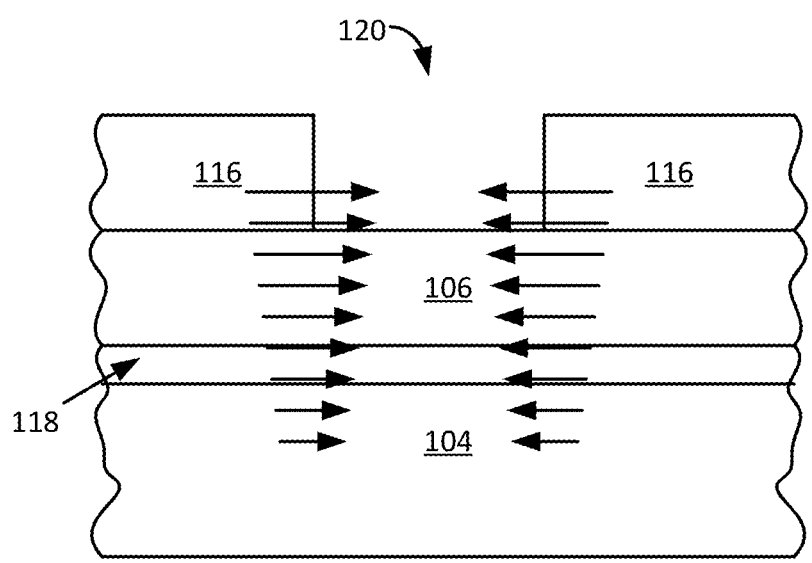
FIG. 2 is a cross-sectional view illustrating intrinsic compressive stress in a dielectric layer, the stress exerted on underlying layers, during fabrication of a semiconductor device.

Embodiments described in the '164 application make use of the fact that many dielectric layers, like dielectric layer 116 of FIG. 1, have significant intrinsic compressive or tensile stress. As shown in FIG. 2, if dielectric layer 116 has intrinsic compressive stress, when it is patterned to form opening 120, dielectric layer 116 will attempt to expand (shown by arrows), exerting compressive stress on barrier 106 and buffer 104, including to channel region 118 of buffer 104 and underneath. As shown by the length of the arrows, the exerted stress decreases with depth, i.e. with distance from passivation layer 116. Arrow length is not to scale. Due to the piezoelectric properties of the crystalline III-V semiconductors typically used for buffer 104, such as GaN, the exerted stress/strain gradient creates a negative piezoelectric charge in barrier 106, channel region 118 and buffer 104. The piezoelectric charge has greatest magnitude where strain gradient is at a maximum, directly beneath the patterned boundaries of passivation layer 116. The strain (which will determine the strain gradient) developed in buffer 104 depends on the width of opening 120 (typically >0.5 µm for a power device) and the strain is generally too small to create significant negative piezoelectric charge. But wide opening 120 (i.e. which corresponds to large gate length) is important for a power device to prevent punch-through current at large drain bias. In the completed device of FIG. 1, the negative piezoelectric charge in channel region 118 and underneath in buffer 104 generally is not sufficient to shift pinch-off voltage.

Figure 3:
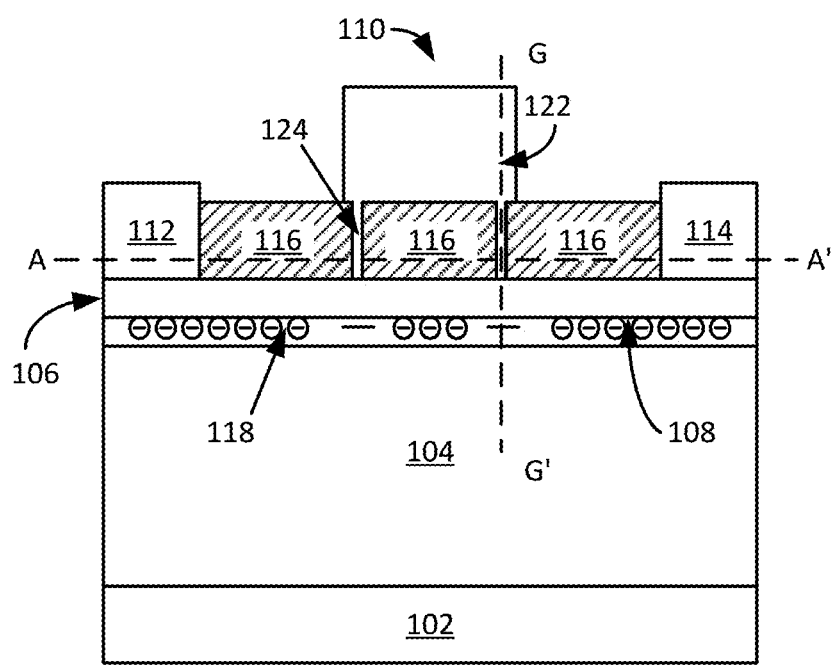
FIG. 3 shows a normally off HFET according to U.S. patent application Ser. No. 15/098,164.

FIG. 3 shows an embodiment of the device of '164 application. HFET 100 has a modified gate 110, which includes (in this example) two tines 124 projecting from main body 122 (which serves as a gate contact), tines 124 disposed between main body 122 and barrier 106. For a narrow tine 124, the two patterned edges of passivation layer 116 are sufficiently close to each other that the stress they exert is cumulative, increasing the strain and strain gradient and thus the negative polarization charge (indicated by the "−" symbol), serving to disrupt the 2DEG underneath, and creating a normally off device.

The device of FIG. 3 can be used alone, but is subject to drain-induced barrier lowering at very high drain voltage, and thus is most suitable for use as a lower-voltage device. In embodiments described herein, a lower-voltage normally off device, as shown in FIG. 3, can be serially connected to a normally on device, as shown in FIG. 1, to form a high-voltage device having positive pinch-off voltage (a normally off device) at high drain bias, with high breakdown voltage.

Figure 4:
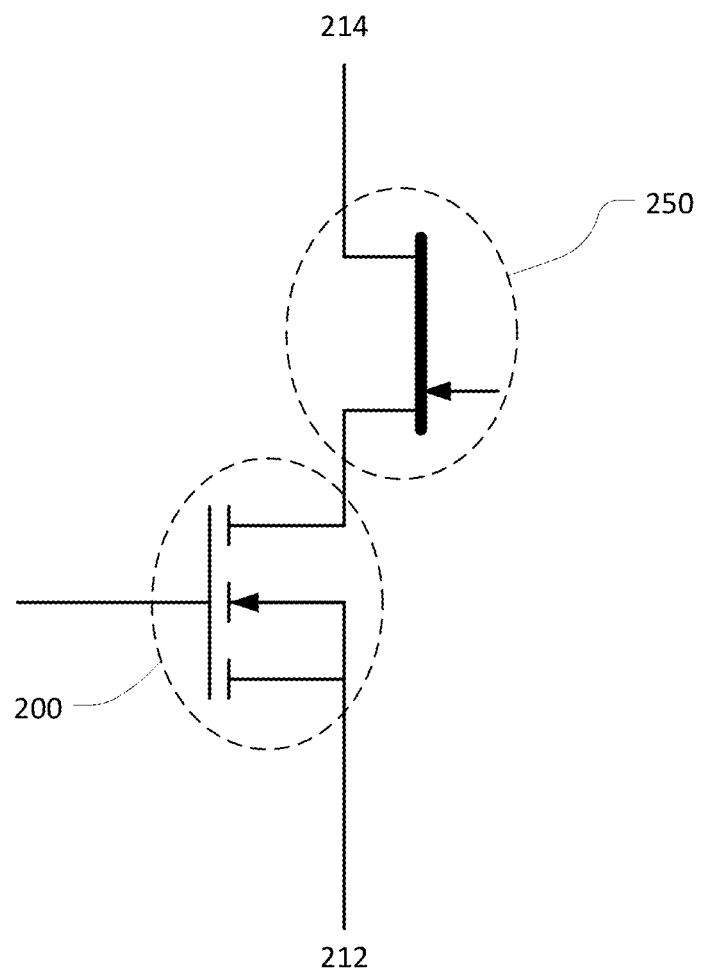
FIG. 4 is a circuit diagram showing a normally off HFET serially connected to a normally on HFET, as described herein.

Referring to FIG. 4, an HFET device as described herein includes source 212, drain 214, and enhancement mode (normally off) HFET 200 serially connected to depletion mode (normally on) HFET 250. As will be seen, normally off HFET 200 is a stress-engineered device including a tined gate having one, two, or more tines. In some embodiments, the gates of HFETs 200 and 250 are electrically connected, while in other embodiments, an input voltage is applied to the gate of HFET 200 while the gate of HFET 250 is held at ground, or a constant DC bias is applied.

Though there are many acceptable variations of the HFET device described herein, two principle variations will be described in detail, each affording different advantages. In one variation, enhancement mode HFET 200 and depletion mode HFET 250 are formed as separate devices, each with its own source and drain. The separate devices are formed on the same chip. In the other variation, enhancement mode HFET 200 and depletion mode HFET 250 are integrated into a more compact device, without intermediate source and drain. In either variation, fabrication is straightforward, with both devices formed using the same process steps. The description to follow will describe methods to fabricate an integrated circuit device comprising the HFET device, either separate or compact.

As will be seen, in both variations, an HFET transistor device includes a first piezoelectric layer supporting a channel region, a second piezoelectric layer over the first piezoelectric layer, an outer source, and an outer drain. A dielectric layer over the second piezoelectric layer electrically separates the outer source and outer drain and has a plurality of segments, two segments of the plurality separated by a first gap. There is a first gate having a first tine connected to a first gate contact, the first tine within the first gap, the first gap having a length of less than about 200 nm. In the first piezoelectric layer immediately beneath the second piezoelectric layer, directly beneath the first gap, stress in the dielectric layer creates a piezoelectric charge of at least about $1\times10^{11}$ per $cm^2$ of electronic charge. A second gate has a length of at least 500 nm. The first gate controls a normally off segment of the channel region, and the second gate controls a normally on segment of the channel region.

Separated HFETs

Figure 5:
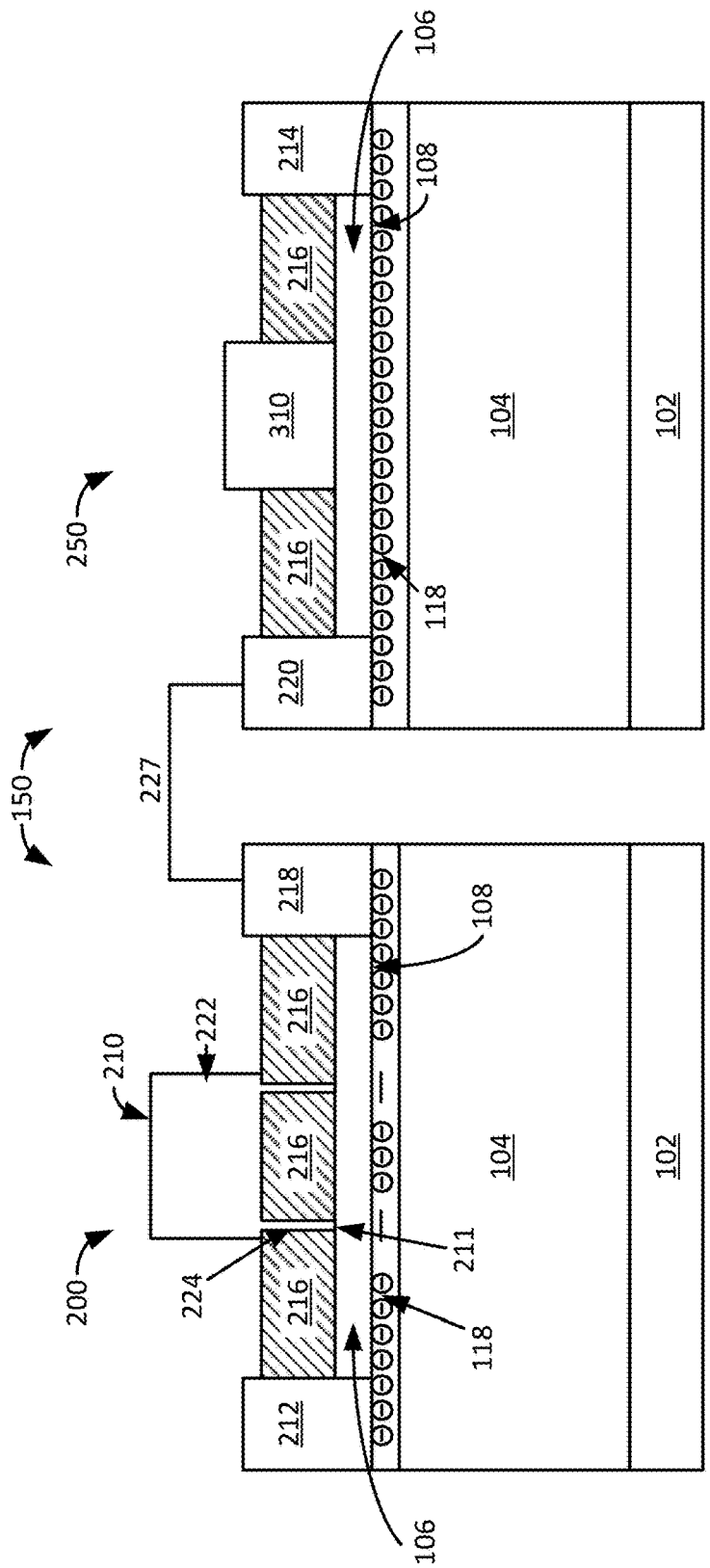
FIG. 5 is a cross-sectional view of an HFET device including a normally off HFET serially connected to a normally on HFET, each HFET having its own source and drain.

FIG. 5 shows a separated HFET device 150. It includes substrate 102, buffer 104, and barrier 106. In the present example, buffer 104 may be monocrystalline GaN and barrier 106 may be monocrystalline $Al_xGa_{1-x}N$ where 0.1<x<1. Other materials may be used, so long as buffer 104 and barrier 106 are both monocrystalline III-V semiconductors having piezoelectric properties, and the material of barrier 106 has a wider band gap than the material of buffer 104. Buffer 104 and barrier 106 meet at heterojunction 108.

In the present and other examples, the material of buffer 104 and barrier 106 is described as monocrystalline. In other embodiments, one or both of these layers may be polycrystalline. For example, in a columnar polycrystalline material, with grains disposed as vertical adjacent columns, the multiple crystals have the same orientation and the material may exhibit piezoelectric properties, and as such be suitable for use in the HFET devices as described herein. As used herein, a "crystalline" material can be either monocrystalline or polycrystalline. A material described herein as "substantially" crystalline is predominantly either monocrystalline or polycrystalline, though, as would be understood by those skilled in the art, normal process variation may lead to occasional flaws.

Separated HFET device 150 comprises normally off HFET 200 and normally on HFET 250, and includes outer source 212, intermediate drain 218, intermediate source 220, and outer drain 214. Enhancement mode tined gate 210 is between outer source 212 and intermediate drain 218. Tined gate 210 has at least one tine 224 projecting from gate contact 222; gate 210 has two tines 224 in the example shown, though in other instances may have a single tine, or may have three tines or more. Each tine 224 is disposed within a gap 211, which separates segments of dielectric 216. Dielectric 216 electrically separates source 212 and drain 214 longitudinally; it will be understood that other elements may separate source 212 and drain 214 as well. Dielectric 216 and has a plurality of segments longitudinally, the segments separated by one or more gaps, such as gap 211. Dielectric 216 applies compressive stress at the edges of gap 211, creating a negative charge immediately beneath barrier 106, on the buffer 104 side of heterojunction 108, exerted directly beneath tine 224. The negative charge serves to disrupt the 2DEG in channel region 118 when no voltage is applied between outer source 212 and tined gate 210. In embodiments, stress exerted by the dielectric layer creates a piezoelectric charge of at least about $1 \times 10^{11}$ per $cm^2$ of electronic charge in channel region 118, in buffer 104 adjacent to barrier 106. Thus gate 210 controls a normally off segment of channel region 118. Any tines 224 have a length, measured parallel to the direction of current flow in channel region 118 of less than about 200 nm. In this discussion, the terms "length" and "longitudinal," when referring to a gate, a tine, or a gap in dielectric layer 216, describes the dimension parallel to the direction of current flow in the channel.

Depletion mode gate 310 is between intermediate source 220 and outer drain 214. The segments of dielectric 216 in normally on HFET 250 may or may not be present, or may not be the same dielectric or have the same characteristics as dielectric 216 in normally off HFET 200. In many HFETs dielectric 216 is included as a passivation layer to reduce or eliminate surface charges. Gate 310 has a length of at least 500 nm. Gate 310 controls a normally on segment of channel region 118.

The materials used for sources, drains, gates, dielectric, etc., may be as described earlier with regard to the devices shown in FIGS. 1 and 3. In other embodiments, a thin gate dielectric between tine or tines 224 and barrier 106, and/or between gate 310 and barrier 106, may be included.

Normally off HFET 200 and normally on HFET 250 are formed on the same wafer. They may be separated by some distance, or they may be immediately adjacent. Intermediate drain 218 and intermediate source 220 may be electrically connected by connection 227 in any suitable fashion. In some embodiments, intermediate drain 218 and intermediate source 220 are integrated into a single electrode. A shorter distance between intermediate drain 218 and intermediate source 220 reduces resistance. The corresponding elements of HFET 200 and HFET 250 are most advantageously formed by the same process steps; i.e. in most embodiments, buffer 104 in HFET 200 and HFET 250 is formed at the same time and by the same process; the same is true for barrier 106. The same pattern and etch steps remove portions of barrier 106 and the same deposition and pattern steps form outer source 212, intermediate drain 218, intermediate source 220, and outer drain 214. A single deposition step forms dielectric layer 216 in both HFET 200 and 250, and a patterning step opens gaps for gate 310 and for tines 224 of gate 210. Gates 210 and 310 are formed in the same deposit, pattern and etch steps.

As noted, in most embodiments, corresponding elements such as, for example, buffer 104, channel layer 118, and barrier 106 of normally off HFET 200 and normally on HFET 250 are formed at the same time of the same materials in the same process step, and in fact are the same layer, even though there is a physical separation between portions of the layer in each device. Thus buffer 104 in normally off HFET 200 and normally on HFET 250 is a single first piezoelectric layer supporting a single channel layer 118. Similarly, barrier 106 in normally off HFET 200 and normally on HFET 250 is a single second piezoelectric layer over the first piezoelectric layer. In this discussion, a "layer" need not be longitudinally continuous.

As compared to the compact integrated device to be described next, the device including separate HFETs affords several advantages. Crosstalk is minimized. The two HFETs can be optimized separately; e.g. if desired, different dielectrics may be used, or the dielectric of one HFET or of the other may be treated in some way to affect the stress applied by the patterned dielectric to underlying layers. Separating the HFETs allows more latitude in the length of dielectric 116, and may allow for more stress in dielectric 116, and thus a more positive pinch-off voltage for the normally off channel region controlled by gate 210 as compared to the integrated device to be described.

It will be seen that dielectric 216 electrically separates outer source 212 and intermediate drain 218, and has a plurality of segments, the segments separated by gaps such as gap 211. Gate 210 is disposed between outer source 212 and intermediate drain 218. Tine or tines 224 are connected to gate contact 222. Gate 310 is disposed between intermediate source 220 and outer drain 214.

In some embodiments, gates 210 and 310 are electrically connected, while in other embodiments, an input voltage is applied to gate 210 while gate 310 is held at ground, or a constant DC bias is applied.

Figure 6:
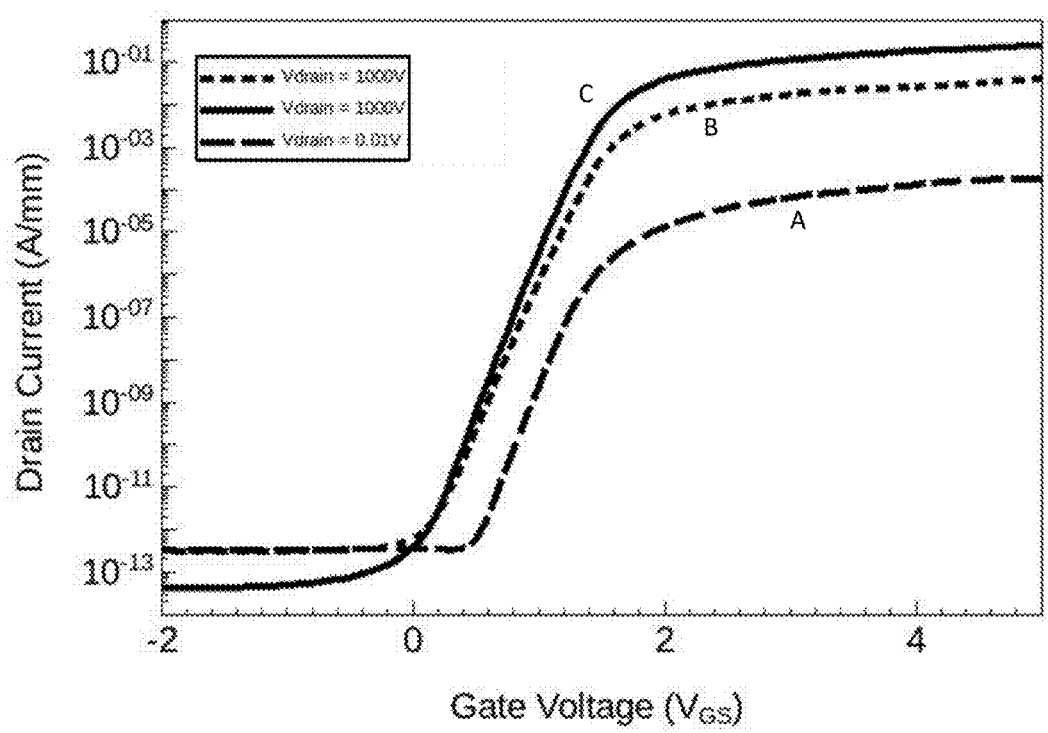
FIG. 6 is a graph showing drain current vs. source-to-gate voltage for the normally off device in HFET devices as described herein.

FIG. 6 shows drain current vs. gate-to-source voltage for the normally off segment of the channel in a simulated device; i.e. an HFET device like that shown in FIG. 5, the two HFETs having separate sources and drains. Curves A and B show drain current ($I_D$) at a given voltage between source and gate ($V_{GS}$) for device 150 when gates 210 and 310 are not connected, i.e. when input voltage is applied to gate 210 and gate 310 is held to ground or at a constant DC voltage. Curve C shows $I_D$ for $V_{GS}$ for device 150 when gates 210 and 310 are connected. For curve A, drain voltage is low, 0.01V, while for curves B and C, drain voltage is higher, 1000V. Pinch-off voltage is considered to be the voltage at which drain current reaches 1E-5 A/mm, a common standard in device electronics.

Pinch-off voltage is positive for all three curves: Most positive, at about 1.9V, at low voltage with gates not connected (curve A), less so but still positive, 1.2V, at high voltage with gates not connected (curve B). When gates are connected at high voltage (curve C), pinch-off voltage (at drain current equal to 1E-5 A/mm) is still positive, at about 1.1V.

As will be understood, the device formed with separated HFETs is necessarily less compact and has increased contact resistance as compared to the integrated device to be described.

Integrated HFETs

Figure 7:
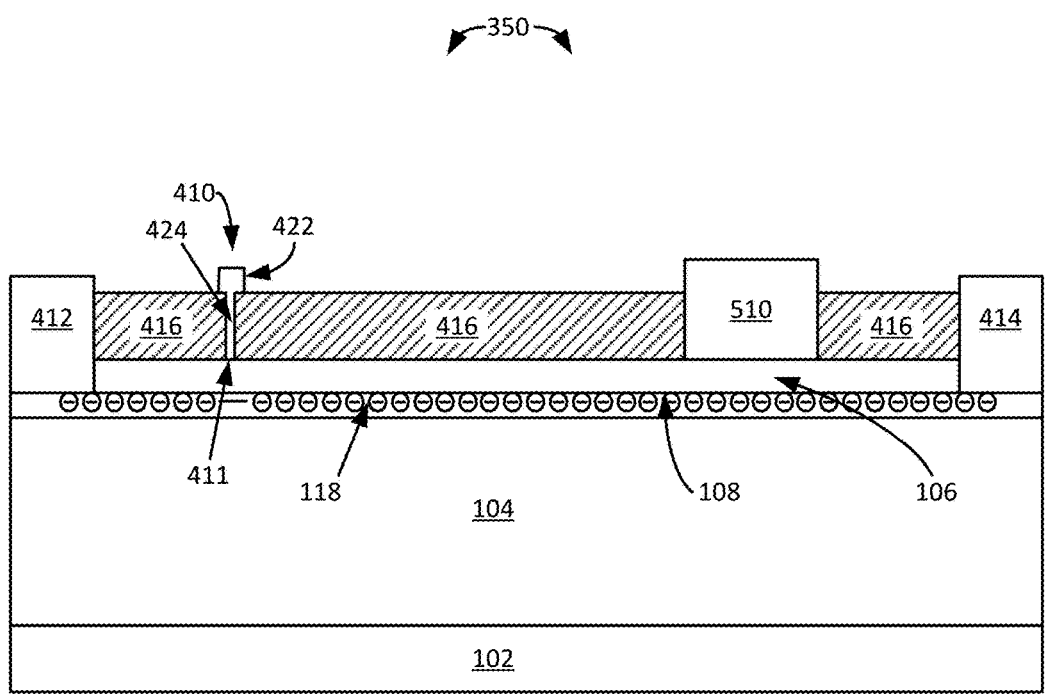
FIG. 7 is a cross-sectional view of a compact, integrated HFET device including a first gate controlling a normally off segment of a channel and a second gate controlling a normally on segment of the channel.

FIG. 7 shows a more compact, integrated HFET device 350 having both normally off and normally on segments of the channel. Substrate 102, buffer 104 and barrier 106 are all semiconductor layers as described earlier. There are two gates, 410 and 510, between source 412 and drain 414.

Enhancement mode gate 410 has one or more tines 424, each connected to a gate contact 422. In the example shown, there is exactly one tine 424, though there may be two, three, or more, each disposed within a gap 411 in dielectric 416. In embodiments with multiple tines, a segment of dielectric 416 is disposed between adjacent tines. The length of each gap 411 within which a tine 424 of enhancement mode gate 410 is disposed is selected to exert stress on buffer 104 in the channel region 118, immediately below barrier 106, directly beneath tine 424. The stress will create a piezoelectric charge sufficient to disrupt the 2DEG with no voltage applied between source 412 and enhancement mode gate 410. The length will be, for example, less than about 200 nm. In embodiments, stress exerted by the dielectric layer creates a piezoelectric charge of at least about $1 \times 10^{11}$ per $cm^2$ of electronic charge in channel region 118.

Depletion mode gate 510 is disposed longitudinally between enhancement mode gate 410 and drain 414, and has a length of at least 500 nm.

Gate 510 is disposed in a gap in dielectric 416. In embodiments, the shortest vertical distance between gate 510 and heterojunction 108 is substantially the same as the shortest vertical distance between tine 424 of gate 410 and heterojunction 108, where "substantially the same" allows for usual process variation. Gate 410 controls a normally off segment of channel region 118, while gate 510 controls a normally on segment of channel region 118.

The distance between gate 510 and the tine 424 of gate 410 that is closest to gate 510 may vary, for example between about 0.5 microns to about 1 mm; typical distance may be between about 0.5 microns and about 10 microns.

The materials used for sources, drains, gates, dielectric, etc., may be as described earlier with regard to the devices shown in FIGS. 1 and 3. In other embodiments, a thin gate dielectric between tine or tines 424 and barrier 106, and between gate 510 and barrier 106, may be included.

For consistency of description, source 412 and drain 414 may be referred to as outer source 412 and outer drain 414. The descriptor "outer" applies to any outermost source and drain, whether or not there is an intermediate source or drain.

Figure 8:
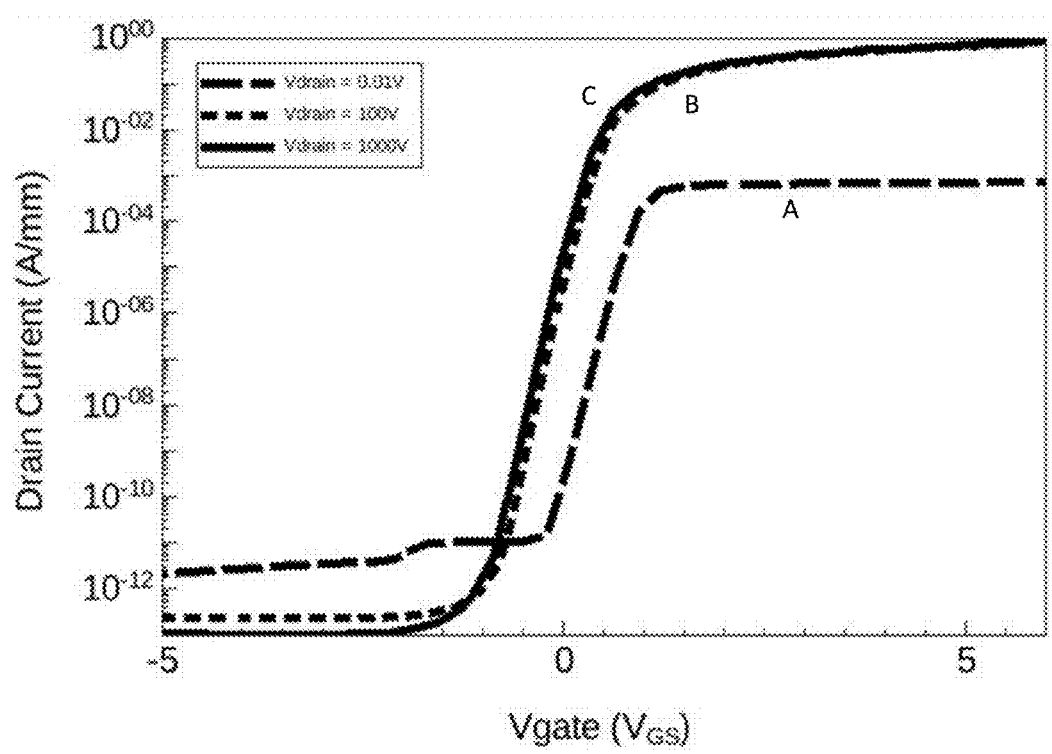
FIG. 8 is a graph showing drain current vs. source-to-gate voltage for the normally off device in HFET devices as described herein.

FIG. 8 shows drain current vs. gate voltage for the normally off segment of the channel in a simulated device. Curves A, B, and C show $I_D$ versus $V_{GS}$ for device 350 when gates 410 and 510 are connected or otherwise held at equal voltage. For curve A, drain voltage is 0.01V; for curve B, drain voltage is 100V; and for curve C, drain voltage is higher, 1000V. Pinch-off voltage is considered herein to be the voltage at which drain current reaches 1E-5 A/mm, a common standard in device electronics.

By comparing this graph with the graph of FIG. 6 it will be seen that, in general, pinch-off voltages are lower for the compact, integrated device than for the separated device. Pinch-off voltage (voltage at which drain current is 1E-5 A/mm) is positive for all three curves. It is most positive, at about 0.7V, at drain voltage of 0.1V (curve A). At drain voltage of 100V (curve B), pinch-off voltage is about 0.04V, and at drain voltage of 1000V (curve C), pinch-off voltage is about 0.01V.

The integrated device 350 of FIG. 7 has a compact layout and reduced series resistance. Compared to the device shown in FIG. 5, integrated device 350 is more susceptible to crosstalk. The integrated device may have a lower positive pinch-off voltage in the normally off region of the channel than would a comparable separated device.

FinFET Variation

Two variations have been provided, but those skilled in the art will envision others. As just one example, a finFET embodiment of an HFET device having a normally off channel region serially connected to a normally on channel region will be described.

Figure 9A:
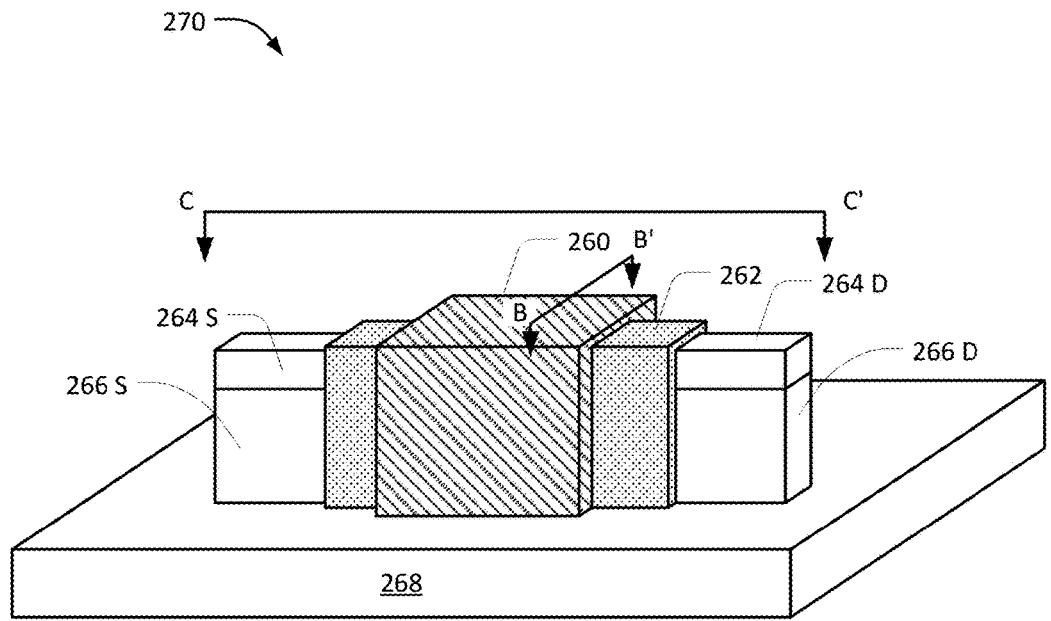
FIGS. 9a and 9b are perspective and cross-sectional views, respectively, of a heterojunction finFET device.
Figure 9B:
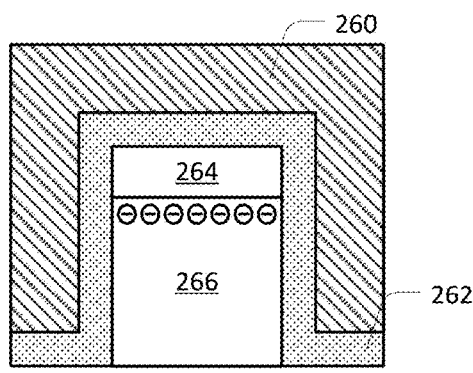

FIG. 9a shows a finFET device, described in more detail in "High-Performance GaN-Based Nanochannel FinFETs With/Without AlGaN/GaN Heterostructure," Im et al., IEEE Transaction on Electron Devices, Vol. 60, No. 10, October, 2013, pp. 3012-3018. FinFET 270 is formed on highly resistive GaN/sapphire substrate 268. Ni/Au gate 260 wraps around an epitaxially grown heterostructure comprising GaN 266 and AlGaN 264; the source and drain of the device are indicated as 264/266S and 264/266D, respectively. The device also includes gate oxide 262. As shown in FIG. 9b, a cross-sectional view taken at B-B', the heterojunction between AlGaN barrier 264 and GaN buffer 266 creates a 2DEG in a channel region at the top of buffer 266.

Figure 10A:
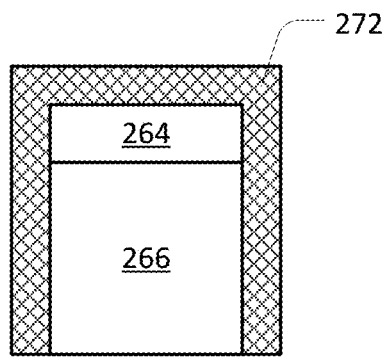
FIGS. 10a, 10b, and 10c are cross-sectional views of the device of FIGS. 9a and 9b showing how it can be modified to become an HFET device having normally off and normally on segments of the channel which are serially connected.
Figure 10B:
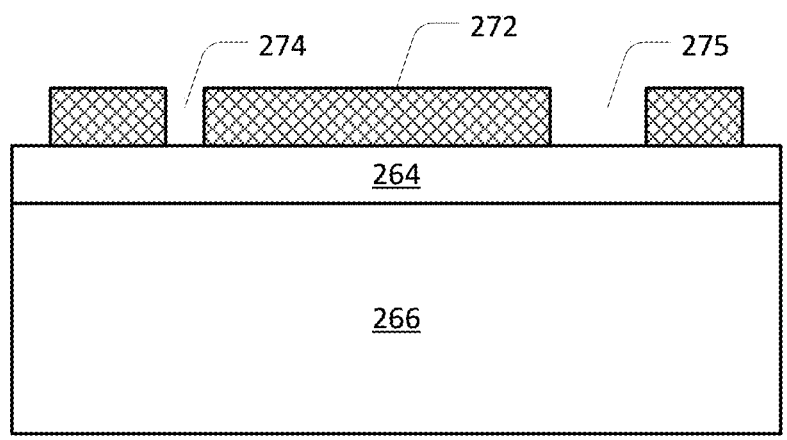
Figure 10C:
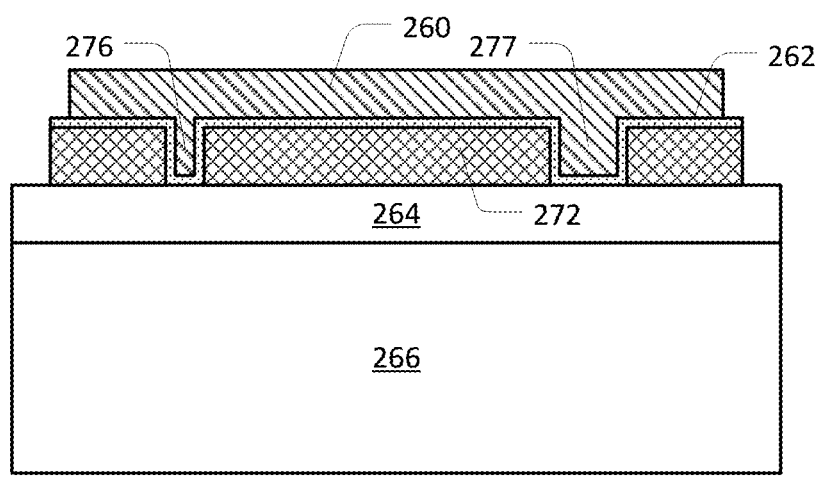

Referring to FIGS. 10a and 10b, finFET 270 can be modified to include a normally off and a normally on channel region. Following epitaxial growth and patterning of GaN layer 266 and AlGaN layer 264, a dielectric layer 272, for example of silicon nitride, may be deposited over the 264/266 heterostructure (cross-sections 10a and 10b taken along B-B' and C-C' of FIG. 9a, respectively.) Narrow tine opening 274 and wider gate opening 275 are patterned in dielectric layer 272. Tine opening 274 may have any desired width, for example between 50 nm and 100 nm, in most embodiments narrow enough to accommodate a tine having a length (parallel to direction of current flow in the channel) of 200 nm or less. Only one tine opening 274 is shown, but in alternate embodiments, there may be two, three, or more. Wider gate opening 275 may be of a dimension sufficient to accommodate a gate having a length of 500 nm or more. Next, referring to FIG. 10c (also a cross-section along C-C'), gate oxide 262 and Ni/Au gate layer 260 are deposited. Gate oxide 262 and gate 260 wrap around heterostructure 264/266. Gate oxide 262 is conformally deposited, and its thickness is selected so as not to completely fill tine opening 274, leaving a gap for formation of tine 276 when gate layer 260 is deposited; for example, its thickness may be between about 5 and 20 nm. Gap 274 in dielectric 272 exerts sufficient stress in the channel region, in buffer 266 immediately below barrier 264 and directly below tine 276, to disrupt the 2DEG, such that tine 276 controls a normally off region of the channel. Gap 275 is wider and does not exert as much stress, such that gate 277 controls a normally on segment of the channel.

Stress Engineering

In order to design an HFET device having a normally off segment of the channel region and a normally on segment of the channel region, there are several factors to be considered to ensure that the desired piezoelectric charge is created in buffer 104 adjacent to heterojunction 108 directly below a tine (see FIGS. 3, 5, and 7).

Different piezoelectric materials have different piezoelectric response. Some materials have a negative piezoelectric charge under compressive stress, while others have a positive charge under compressive stress. The exerted stress decreases with distance from the dielectric layer, so the thickness of barrier 106 and any other intervening layers must be considered.

As a dielectric layer, this discussion has mentioned silicon nitride, which, under many conventional deposition conditions, has intrinsic compressive stress. For example, such a film may be deposited using plasma-enhanced chemical vapor deposition. Temperature may be between about 400-600 deg. C., using, for example, $SiH_4$ and either $NH_3$ or $N_2$ as precursors. A study of silicon nitride deposition conditions and resulting stress, "Interpretation of stress variation in silicon nitride films deposited by electron cyclotron resonance plasma," Besland et al., Journal of Vacuum Science and Technology A, American Vacuum Society, 2004, 22(5), pp. 1962-1970, is hereby incorporated by reference.

Deposition conditions can be altered to customize the amount of stress, and whether the stress is compressive or tensile. In other embodiments, any other suitable material that has high intrinsic compressive stress, or tensile stress, can be used instead of silicon nitride, or combinations or stacks of materials may be used. Simulations of embodiments described herein have assumed intrinsic stress from 2 GPa to −2 GPa. To produce a useful piezoelectric charge in channel region 118, in embodiments compressive or tensile stress exerted by the passivation layer will have an absolute value greater than about 100 megapascals, for example greater than about 200 or about 500 megapascals. It is also known to those skilled in the art that stress in a dielectric that has already been deposited can be modified, for example by ion implantation of argon or some other suitable ion.

The volume of the dielectric layer affects the amount of stress exerted at a patterned edge. Thickness of the dielectric and the longitudinal extend of dielectric, generally defined by gate-to-source, gate-to-drain (in the separated device), and gate-to-gate distances (in the integrated device), as well as the width of the gap within which the tine of a tined gate is disposed, must be carefully selected to produce the desired charge.

Figure 11:
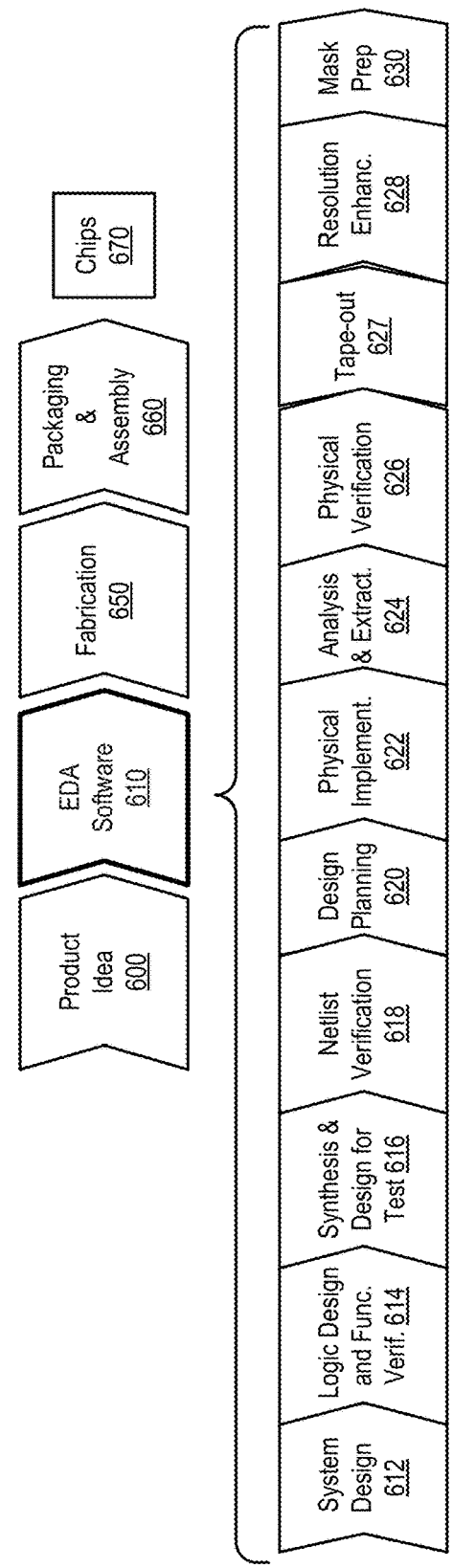
FIG. 11 shows a simplified representation of an illustrative digital integrated circuit design flow.

FIG. 11 shows a simplified representation of an illustrative digital integrated circuit design flow. At a high level, the process starts with the product idea (module 600) and is realized in an EDA (Electronic Design Automation) software design process (module 610). When the design is finalized, it can be taped out (module 627). At some point after tape out, the fabrication process (module 650) and packaging and assembly processes (module 660) occur resulting, ultimately, in finished integrated circuit chips (result 670).

The EDA software design process (module 610) is itself composed of a number of modules 612-630, shown in linear fashion for simplicity. In an actual integrated circuit design process, the particular design might have to go back through modules until certain tests are passed. Similarly, in any actual design process, these modules may occur in different orders and combinations. This description is therefore provided by way of context and general explanation rather than as a specific, or recommended, design flow for a particular integrated circuit.

A brief description of the component modules of the EDA software design process (module 610) will now be provided.

System design (module 612): The designers describe the functionality that they want to implement, they can perform what-if planning to refine functionality, check costs, etc. Hardware-software architecture partitioning can occur at this stage. Example EDA software products from Synopsys, Inc. that can be used at this module include Model Architect, Saber, System Studio, and DesignWare® products.

Logic design and functional verification (module 614): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this module include VCS, VERA, DesignWare®, Magellan, Formality, ESP and LEDA products.

Synthesis and design for test (module 616): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this module include Design Compiler®, Physical Compiler, DFT Compiler, Power Compiler, FPGA Compiler, TetraMAX, and DesignWare® products.

Netlist verification (module 618): At this module, the netlist is checked for compliance with timing constraints and for correspondence with the VHDL/Verilog source code. Example EDA software products from Synopsys, Inc. that can be used at this module include Formality, PrimeTime, and VCS products.

Design planning (module 620): Here, an overall floor plan for the chip is constructed and analyzed for timing and top-level routing. Example EDA software products from Synopsys, Inc. that can be used at this module include Astro and Custom Designer products.

Physical implementation (module 622): The placement (positioning of circuit elements) and routing (connection of the same) occurs at this module, as can selection of library cells to perform specified logic functions. Example EDA software products from Synopsys, Inc. that can be used at this module include the Astro, IC Compiler, and Custom Designer products.

Analysis and extraction (module 624): At this module, the circuit function is verified at a transistor level, this in turn permits what-if refinement. In embodiments, the transistors will include a tined-gate HFET serially connected to a conventional wide-gate HFET as described herein. Example EDA software products from Synopsys, Inc. that can be used at this module include AstroRail, PrimeRail, PrimeTime, and Star-RCXT products.

Physical verification (module 626): At this module various checking functions are performed to ensure correctness for: manufacturing, electrical issues, lithographic issues, and circuitry. Example EDA software products from Synopsys, Inc. that can be used at this module include the Hercules product.

Tape-out (module 627): This module provides the "tape out" data to be used (after lithographic enhancements are applied if appropriate) for production of masks for lithographic use to produce finished chips. Example EDA software products from Synopsys, Inc. that can be used at this module include the IC Compiler and Custom Designer families of products.

Resolution enhancement (module 628): This module involves geometric manipulations of the layout to improve manufacturability of the design. Example EDA software products from Synopsys, Inc. that can be used at this module include Proteus, ProteusAF, and PSMGen products.

Mask data preparation (module 630): This module provides mask-making-ready "tape-out" data for production of masks for lithographic use to produce finished chips. Example EDA software products from Synopsys, Inc. that can be used at this module include the CATS® family of products.

The integrated circuit manufacturing flow includes a related flow, as follows:

(1) Develop individual process modules for manufacturing the integrated circuit. This can be modeled with EDA tools such as the Synopsys, Inc. tools "Sentaurus Process," "Sentaurus Topography," and "Sentaurus Lithography". The input information here includes the materials of the device being simulated, the process conditions like temperature, reactor ambient, implant energy, etc. The output information is the change in geometry or doping profiles or stress distribution.

(2) Integrate the individual process modules into the complete process flow. This can be modeled with EDA tools such as the Synopsys, Inc. tool "Sentaurus Process." The input information here is the collection of the process modules in the appropriate sequence. The output is the geometry, the doping profiles, and the stress distribution for the transistors and the space in between the transistors.

(3) Analyze performance of the transistor manufactured with this process flow. This can be done with EDA tools such as the Synopsys, Inc. tool "Sentaurus Device." The input information here is the output of module (3) and the biases applied to transistor terminals. The output information is the currents and capacitances for each bias combination. In an aspect of the present invention, steps (1)-(3) of the related flow can be used in device modeling simulations to determine IN curves such as those in FIGS. 6 and 8.

(4) If necessary, modify the process modules and the process flow to achieve the desired transistor performance. This can be done iteratively by using tools such as the Synopsys, Inc. tools mentioned above.

Once the process flow is ready, it can be used for manufacturing multiple circuit designs coming from different fabless companies. The EDA flow 612-630 will be used by such fabless companies. The related flow described here can be used at a foundry to develop a process flow that can be used to manufacture designs coming from their fabless customers. A combination of the process flow and the mask preparation 630 are used to manufacture any particular circuit.

Those skilled in the art will appreciate that the EDA flow described above will require minimal modification, during layout for example, to produce a flow to fabricate an HFET device including a tined gate and a conventional wide gate according to embodiments of present invention.

Figure 12:
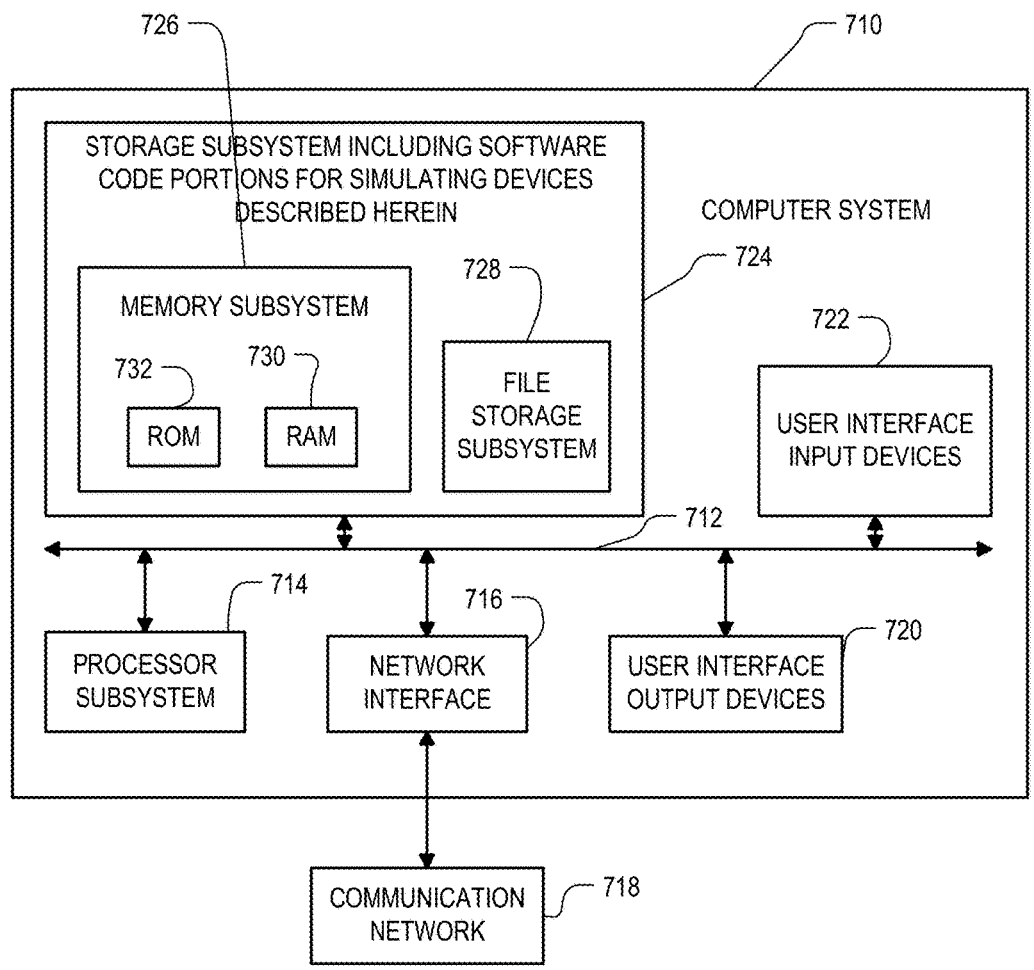
FIG. 12 is a simplified block diagram of a computer system that can be used to implement any of the methods and processes described herein.

FIG. 12 is a simplified block diagram of a computer system 710 that can be used to implement software to design and model an HFET device including a tined gate controlling a normally off segment of the channel and a gate controlling a normally on segment of the channel as described herein. While FIG. 11 indicates individual components as carrying out specified operations, it will be appreciated that each component actually causes the computer system 710 to operate in the specified manner.

Computer system 710 typically includes a processor subsystem 714 which communicates with a number of peripheral devices via bus subsystem 712. These peripheral devices may include a storage subsystem 724, comprising a memory subsystem 726 and a file storage subsystem 728, user interface input devices 722, user interface output devices 720, and a network interface subsystem 716. The input and output devices allow user interaction with computer system 710. Network interface subsystem 716 provides an interface to outside networks, including an interface to communication network 718, and is coupled via communication network 718 to corresponding interface devices in other computer systems. Communication network 718 may comprise many interconnected computer systems and communication links. These communication links may be wireline links, optical links, wireless links, or any other mechanisms for communication of information, but typically it is an IP-based communication network. While in one embodiment, communication network 718 is the Internet, in other embodiments, communication network 718 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 722 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 710 or onto computer network 718.

User interface output devices 720 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 710 to the user or to another machine or computer system.

Storage subsystem 724 stores the basic programming and data constructs that provide the functionality of certain embodiments of the present invention. For example, the various modules implementing the functionality of certain embodiments of the invention may be stored in storage subsystem 724. These software modules are generally executed by processor subsystem 714. These software modules, and any other software relevant to the embodiments described herein, may be stored in a non-transitory manner on a computer readable medium.

Memory subsystem 726 typically includes a number of memories including a main random access memory (RAM) 730 for storage of instructions and data during program execution and a read only memory (ROM) 732 in which fixed instructions are stored. File storage subsystem 728 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 728. The host memory 726 contains, among other things, computer instructions which, when executed by the processor subsystem 714, cause the computer system to operate or perform functions as described herein. As used herein, processes and software that are said to run in or on "the host" or "the computer", execute on the processor subsystem 714 in response to computer instructions and data in the host memory subsystem 726 including any other local or remote storage for such instructions and data.

Bus subsystem 712 provides a mechanism for letting the various components and subsystems of computer system 710 communicate with each other as intended. Although bus subsystem 712 is shown schematically as a single bus, alternative embodiments of the bus subsystem may use multiple busses.

Computer system 710 itself can be of varying types including a personal computer, a portable computer, a workstation, a computer terminal, a network computer, a television, a mainframe, a server farm, or any other data processing system or user device. Due to the ever-changing nature of computers and networks, the description of computer system 710 depicted in FIG. 12 is intended only as a specific example for purposes of illustrating the preferred embodiments of the present invention. Many other configurations of computer system 710 are possible having more or less components than the computer system depicted in FIG. 12.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features.

In particular and without limitation, though many of the inventive aspects are described individually herein, it will be appreciated that many can be combined or used together with each other. All such combinations are intended to be included in the scope of this document.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated.

The invention claimed is:

1. A method of making an integrated circuit device including a heterojunction field effect transistor device, comprising:
   forming a first piezoelectric layer supporting a channel region;
   forming a second piezoelectric layer over the first piezoelectric layer;
   forming an outer source;
   forming an outer drain;
   forming a dielectric layer over the second piezoelectric layer and electrically separating the outer source and outer drain longitudinally, and having a plurality of segments longitudinally, two segments of the plurality separated by a first gap;
   forming a first gate having a first tine connected to a first gate contact, the first tine within the first gap, the first gap having a length of less than 200 nm, wherein in the first piezoelectric layer immediately beneath the second piezoelectric layer, directly beneath the first gap, stress in the dielectric layer creates a piezoelectric charge of at least $1\times10^{11}$ per cm$^2$ of electronic charge; and
   forming a second gate disposed within a second gap in the dielectric layer, the second gap longitudinally separating segments of the plurality of segments, the second gap having a length of at least 500 nm,
   wherein the first gate controls a normally off segment of the channel region, and the second gate controls a normally on segment of the channel region.

2. The method of claim 1 further comprising forming an intermediate source and an intermediate drain, the first gate between the outer source and the intermediate drain, and the second gate between the intermediate source and the outer drain,
   and wherein the intermediate source and the intermediate drain are electrically connected.

3. The method of claim 1, wherein forming a dielectric layer, forming a first gate, and forming a second gate, collectively comprise:
   forming a stressed dielectric layer over the second piezoelectric layer and electrically separating the outer source and outer drain longitudinally;
   forming the first and second gaps in the preliminary dielectric layer; and
   forming the first and second gates in the first and second gaps.

4. The method of claim 1, wherein forming a dielectric layer, forming a first gate, and forming a second gate, collectively comprise:
   forming a preliminary dielectric layer over the second piezoelectric layer and electrically separating the outer source and outer drain longitudinally;
   forming the first and second gaps in the preliminary dielectric layer;
   forming the first and second gates in the first and second gaps; and
   modifying the dielectric layer to increase stress in the dielectric layer sufficiently to create a piezoelectric charge of at least $1\times10^{11}$ per cm$^2$ of electronic charge in the first piezoelectric layer immediately beneath the second piezoelectric layer, directly beneath the first gap.

5. An integrated circuit device made using the method of claim 1.

6. A method of making an integrated circuit device including a heterojunction field effect transistor device, comprising:
   forming a first piezoelectric layer;
   forming a second piezoelectric layer over the first piezoelectric layer, the first and second piezoelectric layers being such as to form a 2DEG region in the first piezoelectric layer where it meets the second piezoelectric layer;
   forming an outer source and an outer drain;
   forming first and second gates between the outer source and outer drain; and
   stressing the first piezoelectric layer sufficiently to disrupt the 2DEG region directly below the first gate, but insufficiently to disrupt the 2DEG region directly below the second gate,
   wherein the first gate controls an enhancement mode segment of the channel, and the second gate controls a depletion mode segment of the channel.

7. The method of claim 6 further comprising forming an intermediate source and an intermediate drain, the first gate between the outer source and the intermediate drain, and the second gate between the intermediate source and the outer drain,
   and wherein the intermediate source and the intermediate drain are electrically connected.

8. The method of claim 6, further comprising electrically connecting the first gate and the second gate.

9. The method of claim 6, wherein the first gate and the second gate are not electrically connected.

10. The method of claim 6, wherein stressing the first piezoelectric layer sufficiently to disrupt the 2DEG region directly below the first gate, comprises inducing stress which creates a piezoelectric charge of at least $1\times10^{11}$ per $cm^2$ of electronic charge in the first piezoelectric layer directly below the first gate.

11. The method of claim 10, wherein inducing stress comprises forming a stressed dielectric layer over the second piezoelectric layer and between the source and the drain, and having a plurality of segments, the segments separated by a plurality of gaps including a first gap, the first gate having a first tine connected to a first gate contact, the first tine within the first gap, the first gap having a length of less than 200 nm;

and wherein the second gate is disposed in a second gap, the second gap disposed between the first gap and the drain and having a length of at least 500 nm.

12. The method of claim 6, wherein stressing comprises:
forming a dielectric layer over the second piezoelectric layer and between the source and the drain, and having a plurality of segments, the segments separated by a plurality of gaps including a first gap and a second gap disposed between the first gap and the drain,
the first gate having a first tine connected to a first gate contact, the first tine within the first gap, the first gap having a length of less than 200 nm; and
the second gate disposed in the second gap, the second gap having a length of at least 500 nm.

13. The method of claim 12, wherein the first piezoelectric layer and the second piezoelectric layer meet at a heterojunction,
and wherein a shortest vertical distance between the first tine and the heterojunction, and a shortest vertical distance between the second gate and the heterojunction are substantially the same.

14. The method of claim 12, the first gate having a second tine connected to the first gate contact, the second tine disposed in a third gap in the dielectric layer, one segment of the plurality of segments of the dielectric layer disposed between the first tine and the second tine, the third gap having a length of less than 200 nm.

15. An integrated circuit device made using the method of claim 6.

16. An integrated circuit device including a heterojunction field effect transistor device, the heterojunction field effect transistor device comprising:
a first piezoelectric layer;
a second piezoelectric layer over the first piezoelectric layer, the first and second piezoelectric layers being such as to form a 2DEG region in the first piezoelectric layer where it meets the second piezoelectric layer;
an outer source;
an outer drain; and
first and second gates between the outer source and outer drain,
wherein the first piezoelectric layer is stressed sufficiently to disrupt the 2DEG region directly below the first gate, but insufficiently to disrupt the 2DEG region directly below the second gate,
and wherein the first gate controls an enhancement mode segment of the channel, and the second gate controls a depletion mode segment of the channel.

17. The device of claim 16 further comprising an intermediate source and an intermediate drain, the first gate between the outer source and the intermediate drain, and the second gate between the intermediate source and the outer drain,
and wherein the intermediate source and the intermediate drain are electrically connected.

18. The device of claim 16, wherein the first gate and the second gate are electrically connected.

19. The device of claim 16, wherein the first gate and the second gate are not electrically connected.

20. The device of claim 16, wherein the first piezoelectric layer is stressed so as to create a piezoelectric charge of at least $1\times10^{11}$ per $cm^2$ of electronic charge in the first piezoelectric layer directly below the first gate.

21. The device of claim 20, wherein the stress creating the piezoelectric charge is induced at least in part by a stressed dielectric layer formed over the second piezoelectric layer and between the source and the drain, and having a plurality of segments, the segments separated by a plurality of gaps including a first gap, the first gate having a first tine connected to a first gate contact, the first tine within the first gap, the first gap having a length of less than 200 nm;
and wherein the second gate is disposed in a second gap, the second gap disposed between the first gap and the drain and having a length of at least 500 nm.

22. The device of claim 16, wherein the stress in the first piezoelectric layer is caused at least in part by:
a dielectric layer over the second piezoelectric layer and between the source and the drain, and having a plurality of segments, the segments separated by a plurality of gaps including a first gap and a second gap disposed between the first gap and the drain,
the first gate having a first tine connected to a first gate contact, the first tine within the first gap, the first gap having a length of less than 200 nm; and
the second gate disposed in the second gap, the second gap having a length of at least 500 nm.

23. The device of claim 22, wherein the first piezoelectric layer and the second piezoelectric layer meet at a heterojunction,
and wherein a shortest vertical distance between the first tine and the heterojunction, and a shortest vertical distance between the second gate and the heterojunction are substantially the same.

24. The device of claim 22, the first gate having a second tine connected to the first gate contact, the second tine disposed in a third gap in the dielectric layer, one segment of the plurality of segments of the dielectric layer disposed between the first tine and the second tine, the third gap having a length of less than 200 nm.

* * * * *